US009625488B2

(12) United States Patent
Che et al.

(10) Patent No.: US 9,625,488 B2
(45) Date of Patent: Apr. 18, 2017

(54) VARIABLE AREA CAPACITIVE LATERAL ACCELERATION SENSOR AND PREPARATION METHOD THEREOF

(71) Applicant: SHANGHAI INSTITUTE OF MICROSYSTEM AND INFORMATION TECHNOLOGY, CHINESE ACADEMY, Shanghai (CN)

(72) Inventors: Lufeng Che, Shanghai (CN); Xiaofeng Zhou, Shanghai (CN); Ruojie Tao, Shanghai (CN); Yuelin Wang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 210 days.

(21) Appl. No.: 14/387,416

(22) PCT Filed: Feb. 26, 2013

(86) PCT No.: PCT/CN2013/071862
§ 371 (c)(1),
(2) Date: Sep. 23, 2014

(87) PCT Pub. No.: WO2014/106361
PCT Pub. Date: Jul. 10, 2014

(65) Prior Publication Data
US 2015/0114118 A1    Apr. 30, 2015

(30) Foreign Application Priority Data

Jan. 5, 2013 (CN) .......................... 2013 1 0002407

(51) Int. Cl.
*G01P 15/125* (2006.01)
*G01P 15/08* (2006.01)
*B81C 1/00* (2006.01)

(52) U.S. Cl.
CPC ........ *G01P 15/125* (2013.01); *B81C 1/00341* (2013.01); *G01P 15/0802* (2013.01);
(Continued)

(58) Field of Classification Search
CPC ..... G01P 2015/0871; G01P 2015/0882; G01P 15/0802; G01P 15/125; G01P 2015/0814; B81C 1/00341; Y10T 29/417
See application file for complete search history.

(56) References Cited

U.S. PATENT DOCUMENTS

2005/0242413 A1* 11/2005 Yarita ................... G01P 15/125
257/595
2010/0122579 A1* 5/2010 Hsu ....................... G01P 15/125
73/514.32

(Continued)

*Primary Examiner* — Francis Gray
(74) *Attorney, Agent, or Firm* — Global IP Services; Tianhua Gu

(57) ABSTRACT

The present invention provides a variable area capacitive lateral acceleration sensor and a preparation method. The acceleration sensor at least includes: three-layer stack structure bonded by a first substrate, a second substrate and a third substrate which are electrically isolated with each other, wherein, the second substrate includes a movable seismic mass, a frame surrounded the movable seismic mass, a elastic beam connected to the movable seismic mass and the frame, a plurality of bar structure electrodes positioned on two surfaces of the movable seismic mass, an anti-overloading structure arranged on the movable seismic mass, etc.; the plurality of first bar structure electrodes on the first substrate and a plurality of second bar structure electrodes on one surface of the second substrate form capacitor structure, the plurality of third bar structure electrodes on the (Continued)

third substrate and a plurality of second bar structure electrodes on one surface of the second substrate form capacitor structure, and those two capacitor form differential sensitive capacitor structure. The present invention has the advantage of high sensitivity and good linearity, and different kinds of beam shapes may be designed as needed, to prepare capacitive acceleration sensors with different sensitivity, and the preparation has high flexibility.

12 Claims, 7 Drawing Sheets

(52) U.S. Cl.
CPC ............... *G01P 2015/0814* (2013.01); *G01P 2015/0871* (2013.01); *Y10T 29/417* (2015.01)

(56) References Cited

U.S. PATENT DOCUMENTS

| | | | |
|---|---|---|---|
| 2011/0048131 A1* | 3/2011 | Reinmuth | B81B 3/0051 73/504.12 |
| 2011/0049653 A1* | 3/2011 | Kanemoto | G01P 15/0802 257/417 |
| 2013/0147313 A1* | 6/2013 | Sachse | H02N 1/008 310/300 |

* cited by examiner

VARIABLE AREA CAPACITIVE LATERAL ACCELERATION SENSOR AND PREPARATION METHOD THEREOF

CROSS REFERENCE TO RELATED PATENT APPLICATION

The present application is the U.S. national stage of PCT/CN2013/071862 filed on Feb. 26, 2013, which claims the priorities of the Chinese patent applications No. 201310002407.3 filed on Jan. 5, 2013, which applications are incorporated herein by reference.

BACKGROUND OF THE PRESENT INVENTION

Field of Invention

The present invention relates to a field of micro-electro-mechanical systems (MEMS), in particular to a variable area capacitive lateral acceleration sensor and a preparation method thereof.

Description of Related Arts

Micro-electro-mechanical systems integrate a plurality of multiple micro mechanism, micro sensors, micro actuators, signal processing, control circuits, communication interfaces, and power supply. In the field of MEMS, excepting for pressure sensors, an acceleration sensor is the sensor with most studied, largest production and largest sales. A micro acceleration sensor is an important inertial sensor, and is used as a test device by converting the physical signal of acceleration into an electrical signal to facilitate the measurement. MEMS acceleration sensor has small size, light weight, little power consumption, fast start, low cost, high reliability, easy realization of digitization and intelligentization. Moreover, since the micromechanical structure has accurate process, highly reproducible, easy in integration, suits for mass production, the micro acceleration sensor is of high performance to price ratio.

According to the type of sensitive signals, MEMS acceleration sensors may be divided into capacitive type, piezoresistive type, piezoelectric type, thermoelectric coupling type, electromagnetic type and the like. Therein, the capacitive acceleration sensor has the advantage of high sensitivity, well stability, small temperature drift, etc, and is one of the most popular acceleration sensors. The capacitive acceleration sensor is provided with a fixed electrode and a movable electrode positioned in a seismic mass, after the capacitive acceleration sensor receiving an acceleration signal, the seismic mass is subjected to inertia force and moves in the opposite direction. The displacement of the seismic mass is limited by a spring and a damper. When the external acceleration is constant, the seismic mass has a certain displacement. As the external acceleration is changed, the displacement of the seismic mass changes accordingly. On the other hand, when the displacement of the seismic mass changes, the capacitance between the movable electrode plate that is connected to a sensitive seismic mass and the electrode plate that is fixed to an anchor zone changes accordingly; if the change of the output voltage of the sensor is measured, the displacement of the seismic mass is equivalent to be measured. Since the displacement of a seismic mass has one-to-one correspondence with the acceleration to be measured, then the output voltage and the external acceleration have a certain relationship, that is the external acceleration can be measured through the output voltage.

Capacitive MEMS acceleration sensors have various kinds of structure, mainly including sandwich structure and comb-finger structure. Sandwich capacitive acceleration sensors are basically variable gap capacitive type, and are mainly sensitive to longitudinal acceleration signal, because the seismic mass in the sandwich capacitive acceleration sensor can be made bigger, hence the sandwich capacitive acceleration sensor has high sensitivity and high test precision; while comb-finger capacitive acceleration sensors are basically variable area capacitive type, and are mainly sensitive to lateral acceleration signal, due to the employment of variable area pattern, the comb-finger capacitive acceleration sensors as prepared have better nonlinearity.

The method for preparing the sandwich capacitive acceleration sensors is mainly the method of bulk silicon micro-machining. In order to improve the detection sensitivity of micro acceleration sensors, various research institutions and companies have provided a variety of methods. Specifically, the methods include increasing the mass of a sensitive seismic mass and using a full symmetrical differential structure.

For example, W. S. Henrion et al. employ a double layer bonded silicon beam method to form a beam-mass structure whose double sides are parallel and symmetrical (cf. Sensors structure with L-shaped spring legs, U.S. Pat. No. 5,652, 384), the process thereof may employ a method combining KOH etching with dry deep etching releasing. Namely: firstly, KOH is used to etch the silicon wafer from the back to a thickness of the remaining beam, dry deep etching is then used to release the beam-mass structure from the front; two same beam-mass are further bonded back to back to achieve a dual-side structure. The process is complicated and the cost is comparatively high.

The method for preparing the comb-finger capacitive acceleration sensors is mainly the method of surface micromachining.

For example, ADXLXX series micro acceleration sensors of AD company in America use the capacitive acceleration sensor with uniform comb-fingers. The process for those sensors has good compatibility with the integrated circuit processing technology, however because of the structural relationships, the sensitive seismic mass are unable to make big, hence the sensors may not achieve high performance.

SUMMARY OF THE PRESENT INVENTION

In view of the abovementioned disadvantages in the prior art, the object of the present invention is to provide a variable area capacitive lateral acceleration sensor with high sensitivity and good linearity.

Another object of the present invention is to provide a method for preparing a variable area capacitive lateral acceleration sensor, so as to prepare capacitive micro-acceleration sensors with different measuring ranges and different sensitivities.

In order to achieve the abovementioned objects and other relevant objects, the present invention provides a method for preparing a variable area capacitive lateral acceleration sensor, that at least including the steps of:

Forming a plurality of first bar structure electrodes at recesses on a first substrate surface;

Bonding the first substrate surface and a second substrate surface into a first bonding structure, causing the plurality of the first bar structure electrodes on the first substrate and a plurality of second bar structure electrodes on one surface of the second substrate to form capacitor structure, respectively, and the first substrate and the second substrate are electrically isolated;

Forming a movable seismic mass structure, a elastic beam structure and a anti-overloading structure on the second substrate of the bonding structure, and causing the plurality of the second bar structure electrodes to be positioned on the two surface of the movable seismic mass structure, respectively;

Forming a plurality of third bar structure electrodes at recesses on a third substrate;

Bonding the third substrate and the second substrate where the movable seismic mass structure has been formed into a second bonding structure, causing the plurality of third bar structure electrodes on the third substrate and a plurality of second bar structure electrodes on the other surface of the second substrate to form capacitor structure, respectively, and the third substrate and the second substrate are electrically isolated;

Forming electrode lead via-holes at the first substrate or the third substrate of the second bonding structure, and preparing electrodes.

Preferably, the first substrate and the third substrate are silicon wafers after oxidation.

Preferably, the depth of the recesses of the first substrate and the second substrate does not exceed 5 μm.

Preferably, the second bar structure electrodes on the two surfaces of the second substrate have one-to-one correspondence, and have same shape.

Preferably, the silicon oxide layer left by the preparation of recesses is directly used as an insulation layer of the three bonding substrate.

Preferably, the elastic beam structure as formed on the second substrate is H-shape, or a composite structure consisting of H-shaped elastic beam and supporting beam, etc.

The present invention further provides a variable area type capacitive lateral acceleration sensor, at least including:

Three-layer stack structure bonded by a first substrate, a second substrate and a third substrate, which are electrically isolated from each other, therein, The second substrate includes a movable seismic mass, a frame to surround the movable seismic mass, a elastic beam connected to the movable seismic mass and the frame, a plurality of second bar structure electrodes positioned on two surfaces of the movable seismic mass, an anti-overloading structure and an electrode arranged on the movable seismic mass;

the plurality of first bar structure electrodes on the first substrate and a plurality of second bar structure electrodes on the second substrate form capacitor structures, respectively, the plurality of third bar structure electrodes on the third substrate and the plurality of second bar structure electrodes on the second substrate form capacitor structures, respectively;

the first substrate is provided with electrode lead via-holes and an electrode, the third substrate is provided with an electrode as well.

Preferably, the gap between a first bar structure electrode and a second bar structure electrode is determined by the thickness of the silicon oxide layer of the first substrate.

Preferably, the gap between a third bar structure electrode and a second bar structure electrode is determined by the thickness of the silicon oxide layer of the third substrate.

Preferably, the differential sensitive capacitor structure is formed by combining the capacitor structure which is formed by the first bar structure electrode of the first substrate and the second bar structure electrode of the second substrate, and the capacitor structure which is formed by the third bar structure electrode of the third substrate and the second bar structure electrode of the second substrate.

Preferably, the elastic beam includes an H-shaped elastic beam, or includes an H-shaped elastic beam and a support beam, etc.

As mentioned above, the variable area type capacitive lateral acceleration sensor and the preparation method of the present invention have the following beneficial effects: simultaneously has the advantages of the high sensitivity of a sandwich variable gap capacitive acceleration sensor and the good linearity of a comb-finger variable area capacitive acceleration sensor, and different kinds of beam shape may be designed as needed, to prepare capacitive acceleration sensors of the present invention with different sensitivity, and the preparation has high flexibility.

DESCRIPTION OF NUMERALS

Figure 1A:
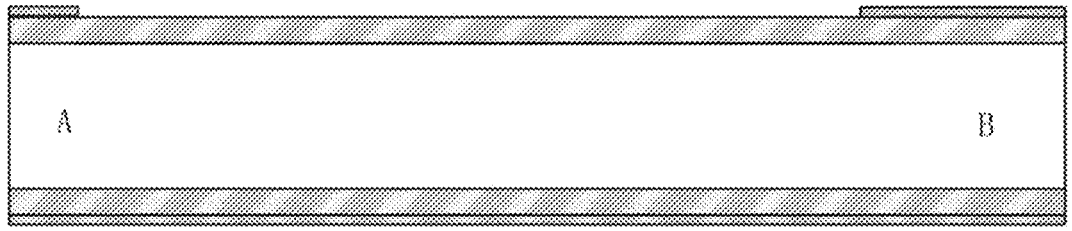
FIGS. 1a-1d are flow charts of a method preparing a first substrate structure and a third substrate structure of a variable area capacitive lateral acceleration sensor of the present invention.

1 First substrate structural layer
11 Electrode lead via-holes
12 First bar structure electrode
13 Metal layer
14 Silicon oxide layer
2 Second substrate structural layer
21 Frame
22 Movable seismic mass
23 Elastic beam
24 Metal layer
25 Second bar structure electrode
26 Anti-overloading protection structure
3 Third substrate structural layer
31 Metal layer
32 Third bar structure electrode
33 Silicon oxide layer
4, 5 Capacitive gap

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1a to FIG. 4b. It is should be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

The method for preparing a variable area capacitive lateral acceleration sensor of the present invention includes the following steps:

1. The Preparation Process of a First Substrate Structure and a Third Substrate Structure:

(1) Taking a thermally oxidized silicon wafer as a substrate, performing photolithography, forming initial capacitive gap photoresist mask pattern, as illustrated in FIG. 1a.

Figure 1B:
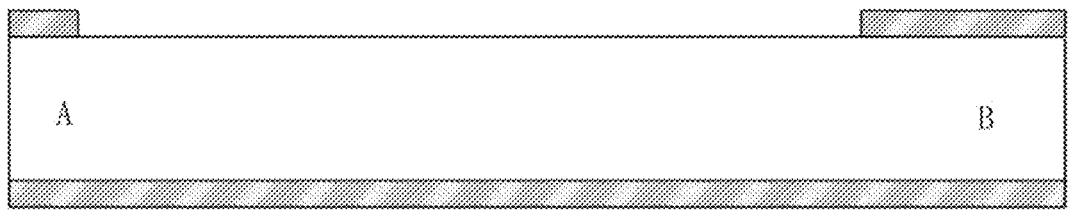

(2) Performing etching at the silicon oxide layer of one surface of an oxidized substrate based on wet etching, causing the surface to be concave, and removing the remaining mask photoresist, as illustrated in FIG. 1b. Therein, the recess is used as a capacitive gap of a capacitor structure as subsequent formed, and the depth thereof does not exceed 5 μm.

Figure 1C:
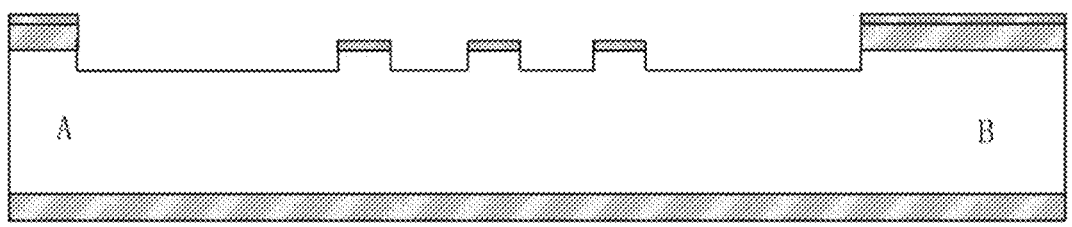

(3) Forming a plurality of first bar structure electrodes at the recess of the electrode plate based on photolithography and dry etching, respectively, as illustrated in FIG. 1c.

Figure 1D:
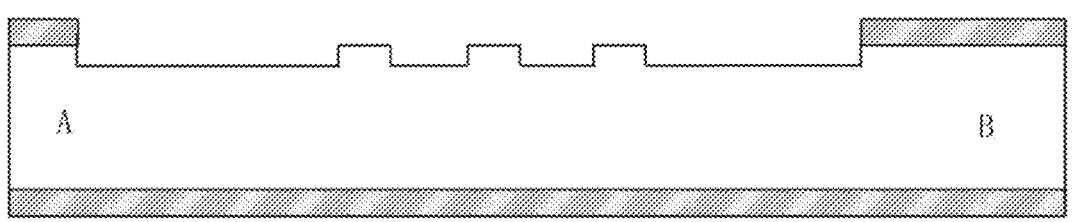

(4) Removing the remaining photoresist mask, to obtain a first substrate structure with the plurality of first bar structure electrodes as formed, as illustrated in FIG. 1d.

(5) Preparing a third substrate structure with a plurality of third bar structure electrodes in the same way of preparing the first substrate structure.

Figure 2A:
FIGS. 2a-2b are flow charts of a method preparing a second substrate structure of a variable area capacitive lateral acceleration sensor of the present invention.

2. The Preparation Process of Bar Structure Electrodes of a Second Substrate Structure:

(1) Taking a super flat silicon wafer as a substrate, forming a bar structure electrode structural photoresist mask through photolithography, as illustrated in FIG. 2a.

Figure 2B:
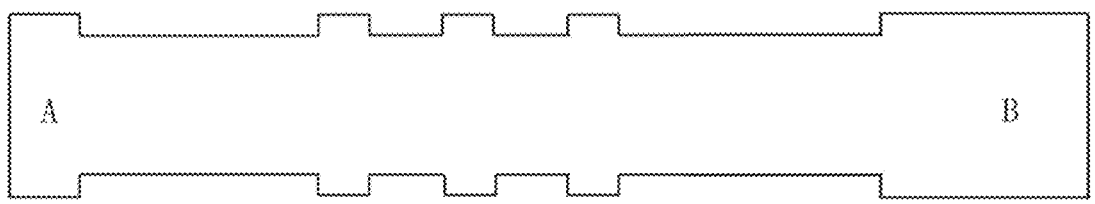

(2) Forming a plurality of second bar structure electrodes at a part of the upper and lower surfaces of the substrate which is corresponding to a movable seismic mass based on dry etching, removing remaining mask photoresist, to obtain a second substrate structure having symmetrical second bar structure electrodes on the upper and lower surfaces, as illustrated in FIG. 2b.

Figure 3A:
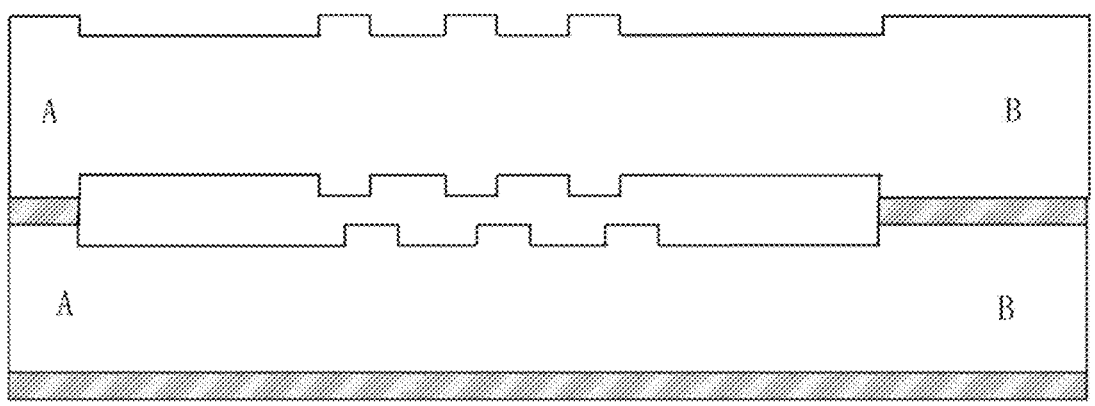
FIGS. 3a-3e are flow charts of a method preparing a integral structure of a capacitive lateral acceleration sensor of the present invention.

3. The Preparation Process of a Sandwich Variable Area Capacitive Lateral Acceleration Sensor:

(1) Bonding the first substrate structure and the second substrate structure, to form a bonded wafer, as illustrated in FIG. 3a.

Figure 3B:
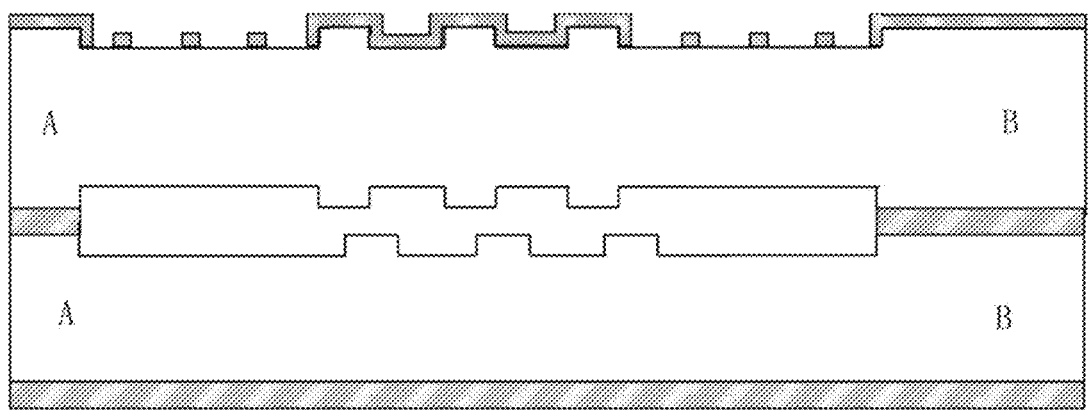

(2) Taking the bonded wafer as a substrate, preparing an elastic beam, a movable seismic mass and photoresist mask of anti-overloading protection structure through photolithography, as illustrated in FIG. 3b.

Figure 3C:
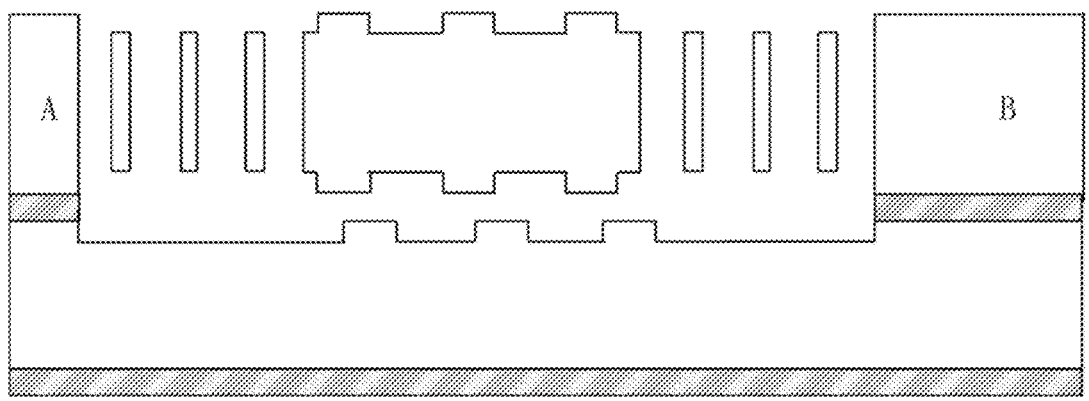

(3) Etch-releasing the elastic beam and the movable seismic mass by dry deep etching technique, and simultaneously forming anti-overloading protection structure, and removing the remaining mask photoresist, as illustrated in FIG. 3c.

Figure 3D:
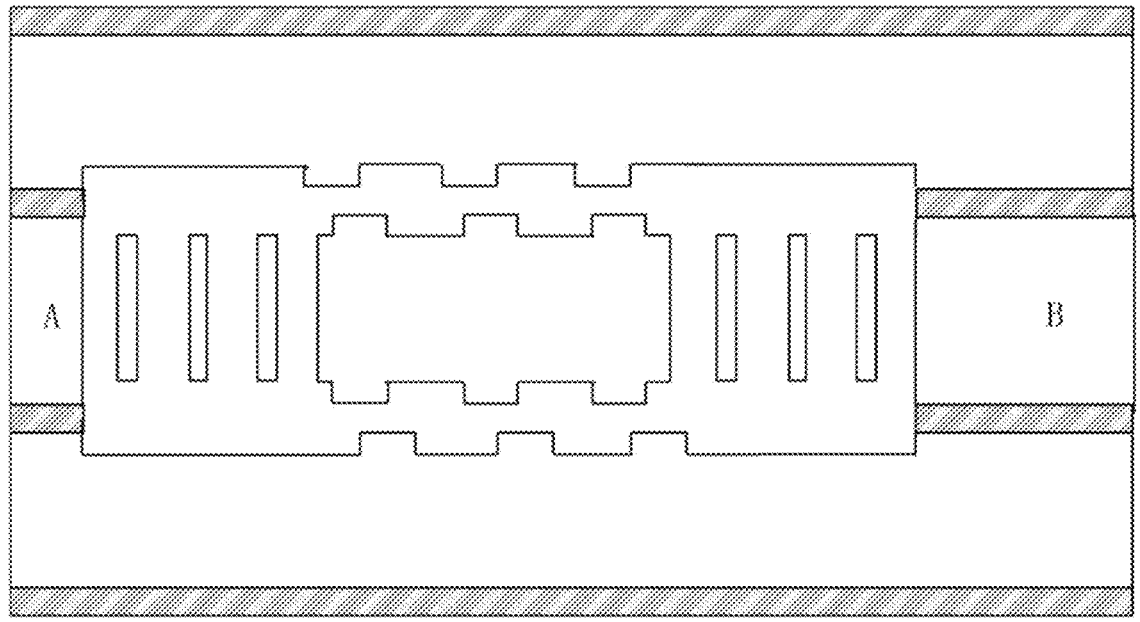

(4) Bonding the bonded wafer and the third substrate structure again, to obtain a sandwich structure having the function of sensitivity of lateral acceleration, as illustrated in FIG. 3d.

(5) Performing photolithography on the first substrate structure of the sandwich bonded wafer, forming a lead via-hole photoresist mask, creating a KOH etching window through etching by a BOE etching solution, after the creation of etching window, removing the photoresist mask, making a silicon oxide layer as a mask layer, performing anisotropic etching of silicon, forming an electrode lead via-hole of the middle electrode of the movable seismic mass, and finally removing the silicon oxide which is used as masking layer.

Figure 3E:
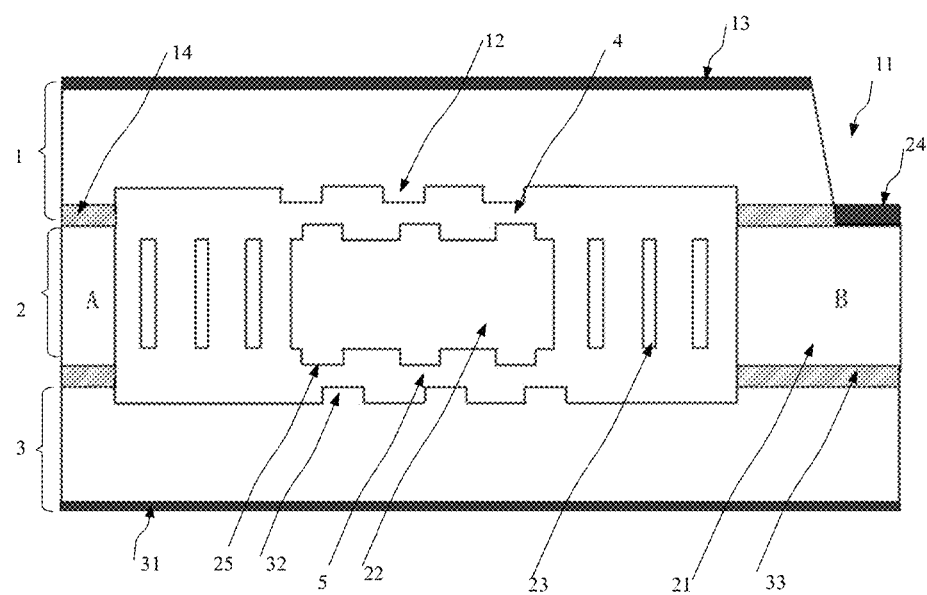

(6) Preparing the lead electrode of the sandwich structural bonded wafer: i.e., metal layers are fabricated at the front and back sides of the sandwich structural bonded wafer by sputtering, evaporation, etc., wherein the materials of the metal layer include, but not limited to, Al, Au, Ni, and the like, as illustrated in FIG. 3e.

Figure 3F:
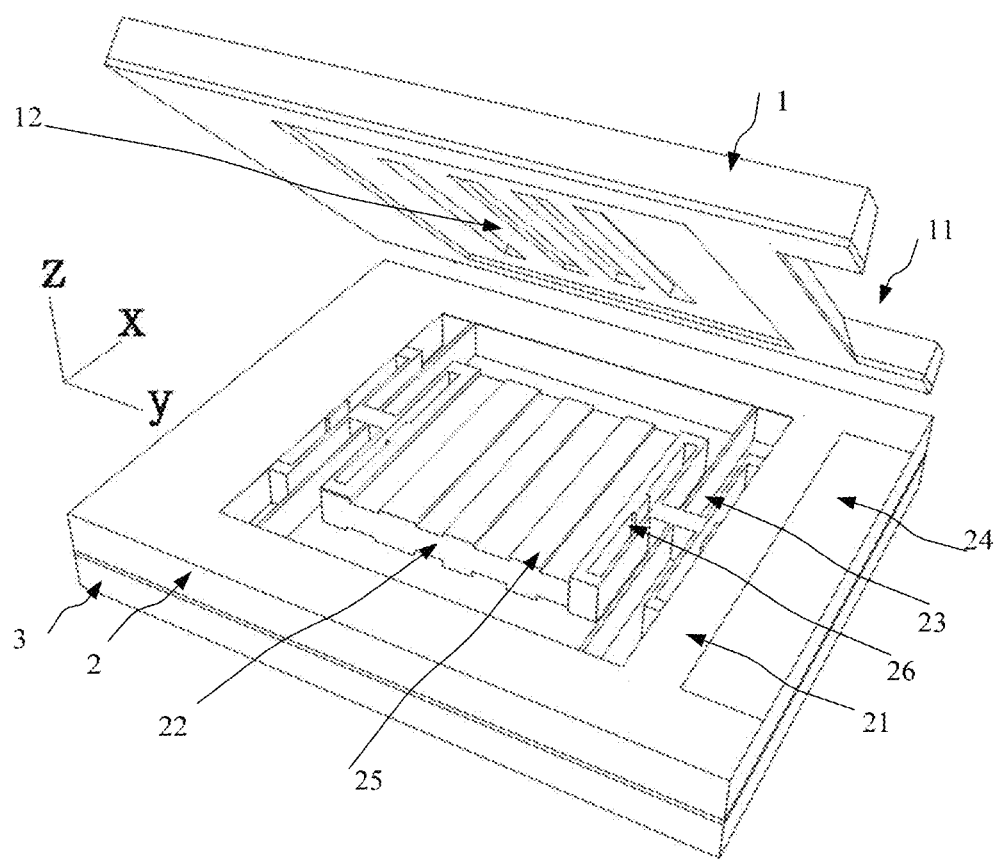
FIG. 3f is a stereogram of a variable area capacitive lateral acceleration sensor of the present invention.

Through the foregoing steps, a variable area capacitive lateral acceleration sensor as formed is prepared as illustrated in FIGS. 3e to 3f, the variable area capacitive lateral acceleration sensor at least includes: a first substrate structural layer 1, a second substrate structural layer 2 and a third substrate structural layer 3.

Therein, the first substrate structural layer 1 is provided with an electrode lead via-hole 11, a plurality of first bar structure electrodes 12 and a metal layer 13 used as a lead electrode; the third substrate structural layer 3 is provided with a metal layer 31 used as a lead electrode and a plurality of third bar structure electrodes 32; the second substrate structural layer 2 includes: an anchor frame 21 which is formed based on the silicon substrate, a movable seismic mass 22, a elastic beam 23 with one end connected to the frame 21 and the other end connected to the movable seismic mass 22, and a metal layer 24 used as a lead electrode, therein, each of the two surfaces of the movable seismic mass 22 is provided with a plurality of second bar structure electrodes 25, the second bar structure electrodes 25 on the two surfaces are structurally symmetrical and form capacitor structure with the first bar structure electrode 12 of the first substrate structure layer 1 and the third bar structure electrode 32 of the third substrate structure layer 3, respectively, further form a differential sensitive capacitor structure; moreover, the movable seismic mass 22 and the anchor frame 21 are provided with anti-overloading protection structures 26 along the sensing axis; the capacitive gap 4 between the first bar structure electrode 12 of the first substrate structure layer 1 and the second bar structure electrode 25 of the second substrate structure layer 2 is determined by the thickness of the oxide layer 14 of the first substrate structure layer 1, the capacitive gap 5 between the third bar structure electrode 32 of the third substrate structure layer 3 and the second bar structure electrode 25 of the second substrate structure layer 2 is determined by the thickness of the oxide layer 33 of the third substrate structure layer 3. As shown in the figure, the first substrate structure layer 1 and the second substrate structure layer 2 are electrically isolated by the silicon oxide layer 14; the third substrate structure layer 3 and the second substrate structure layer 2 are electrically isolated by the silicon oxide layer 33.

Figure 4A:
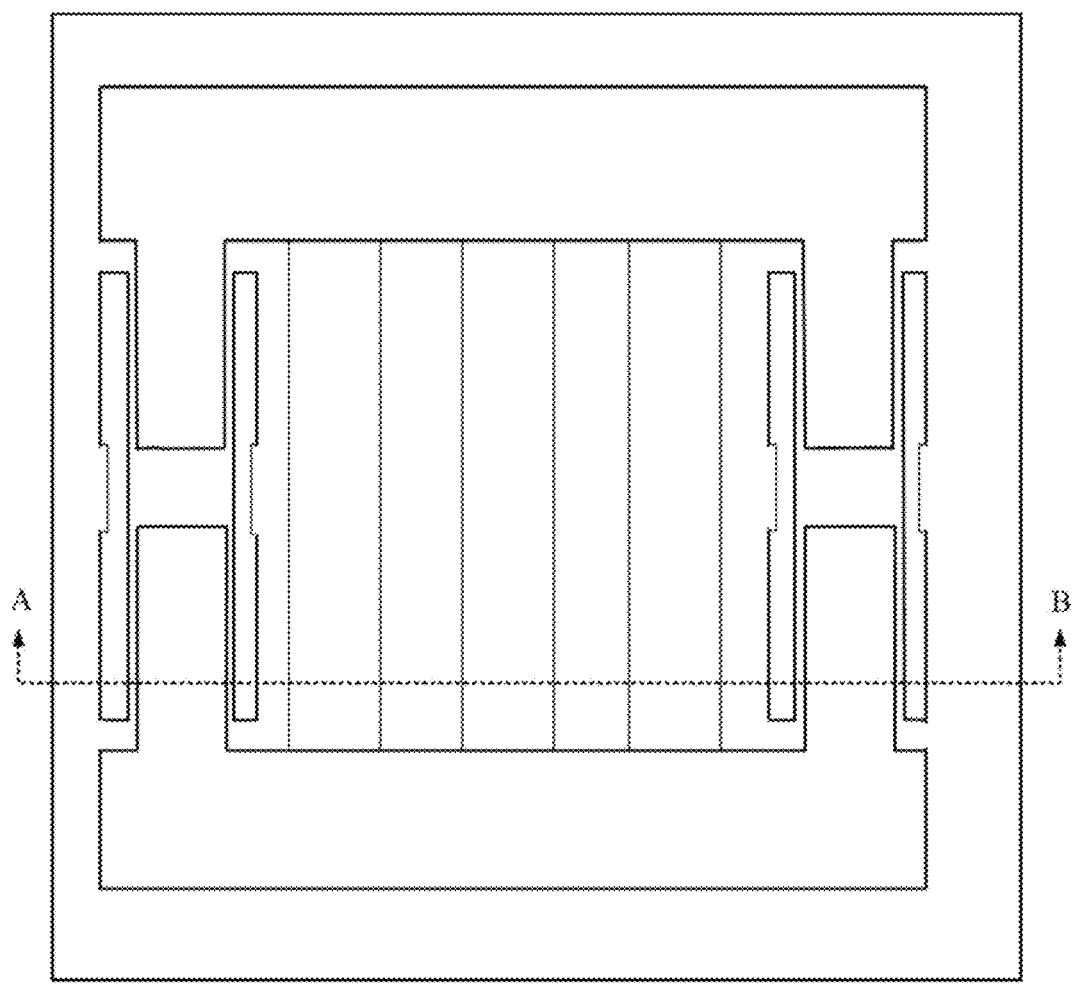
FIG. 4a is a preferential vertical view of a elastic beam of a variable area capacitive lateral acceleration sensor of the present invention.

Preferably, the elastic beam 23 may use a H-shaped elastic beam, for example, as illustrated in FIG. 4a, the elastic beam of the capacitive acceleration sensor directly uses H-shaped elastic beam.

Figure 4B:
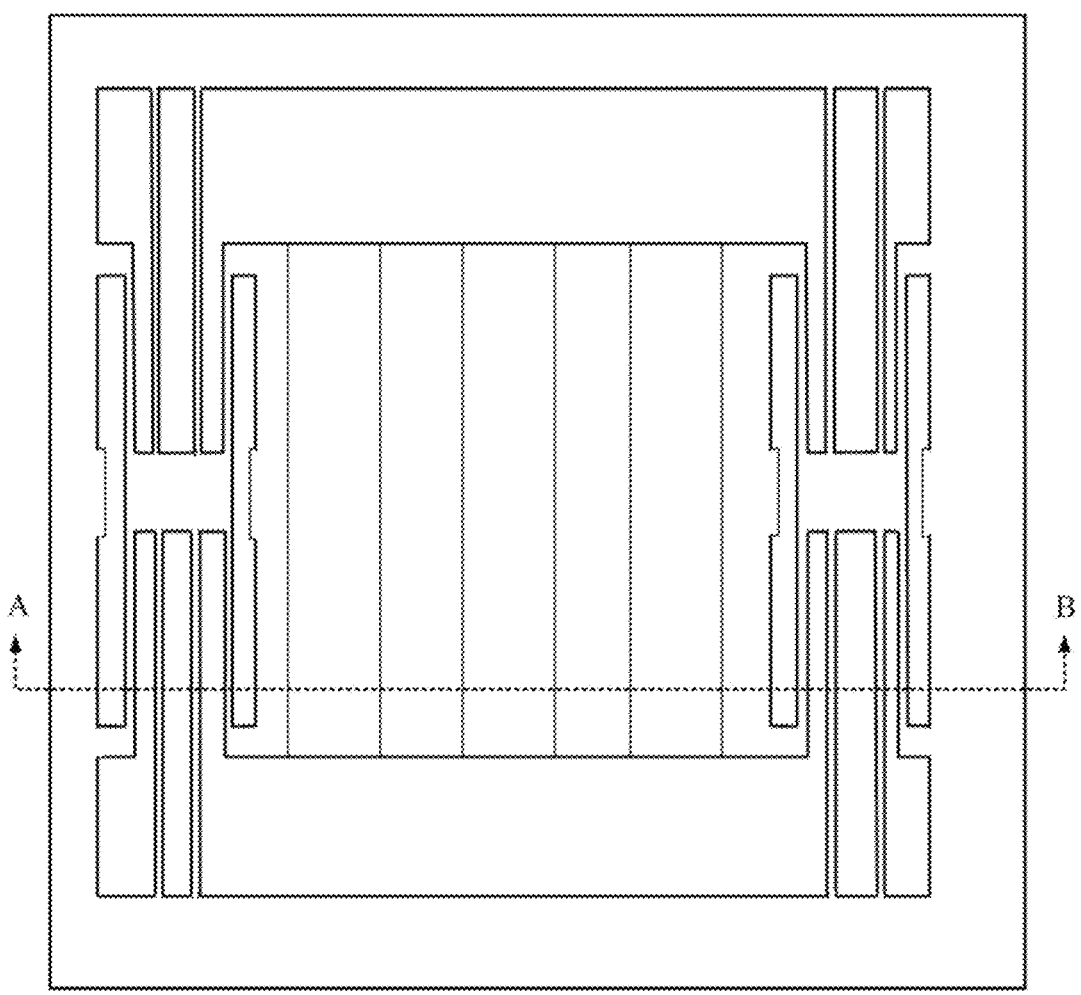
FIG. 4b is another preferential vertical view of a elastic beam of a variable area capacitive lateral acceleration sensor of the present invention.

Preferably, the elastic beam 23 may also use an H-shaped elastic beam combining with a supporting beam so as to optimize the property of a sensor, the number of the H-shaped beams and the supporting beams as well as the total length, total width of a beam may be determined according to sensitivity and the like. For example, as illustrated in FIG. 4b, the elastic beam of the capacitive acceleration sensor directly use an H-shaped beam combining with two supporting beams as a composite elastic beam structure, to reduce the cross sensitivity of a sensor.

It should be noted that the abovementioned preparation process of the variable area capacitive lateral acceleration sensor is used as a demonstration, rather than being used to limit the present invention, actually, any other patterns that forming a plurality of first bar structure electrodes on one surface of the first substrate, forming a plurality of first bar structure electrodes on the two surfaces of the second substrate, forming a plurality of third bar structure electrodes on one surface of the third substrate, forming a movable seismic mass structure, elastic beam structure and anti-overloading structure on the second substrate of the bonding structure and the like, are included within the scope of the present invention.

In summary, the method for preparing a variable area capacitive lateral acceleration sensor of the present invention, as compared with the existing preparation method, has simple fabricating process, and can simultaneously accomplish the fabrication of a beam, a seismic mass structure and an anti-overloading structure; moreover, the sensor as prepared simultaneously has the advantages of the large seismic mass in the sandwich structure and the variable area capacitive of the comb-finger sensors, and simultaneously possesses the high property of high sensitivity and good linearity; and different types, different width, and different length of elastic beams may be designed as needed, so as to change the sensitivity of the sensors, so the preparation has high flexibility. Therefore, the present invention effectively overcomes all kinds of disadvantages in the prior art and has highly industrial utilization values.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A preparation method for a variable area capacitive lateral acceleration sensor, wherein said method for preparing the variable area capacitive lateral acceleration sensor at least including the steps of:
    forming a plurality of first bar structure electrodes at recesses on a surface of a first substrate;
    forming a plurality of second bar structure electrodes at recesses on an upper surface and a lower surface of a second substrate;
    bonding the first substrate and a second substrate into a first bonded structure, causing the plurality of first bar structure electrodes on the first substrate and a plurality of second bar structure electrodes on the one surface of the second substrate to form capacitor structure, respectively, and the first substrate and the second substrate are electrically isolated;
    forming a movable seismic mass structure, a elastic beam structure and a anti-overloading structure on the second substrate of the bonded structure, and causing the plurality of the second bar structure electrodes to be positioned on the upper surface and the lower surface of the movable seismic mass structure, respectively;
    forming a plurality of third bar structure electrodes at recesses on a third substrate;
    bonding the third substrate and the second substrate where the movable seismic mass structure has been formed into a second bonded structure, causing the plurality of third bar structure electrodes on the third substrate and a plurality of second bar structure electrodes on the other surface of the second substrate to form capacitor structure, respectively, and the third substrate and the second substrate are electrically isolated;
    forming electrode lead via-holes at the first substrate or the third substrate of the second bonded structure, and preparing electrodes.

2. The method for preparing a variable area capacitive lateral acceleration sensor as in claim 1, wherein the depth of the recesses of the first substrate and the second substrate does not exceed 5 μm.

3. The method for preparing a variable area capacitive lateral acceleration sensor as in claim 1, wherein the silicon oxide layer left by the preparation of recesses is directly used as an insulation layer of the three bonded substrate.

4. The method for preparing a variable area capacitive lateral acceleration sensor as in claim 1, wherein the second bar structure electrodes on the upper surface and lower surface of the second substrate have one-to-one correspondence and same shape.

5. The method for preparing a variable area capacitive lateral acceleration sensor as in claim 1, wherein the elastic beam structure as formed on the second substrate is H-shape.

6. The method for preparing a variable area capacitive lateral acceleration sensor as in claim 1, wherein the elastic beam structure as formed on the second substrate is a composite structure consisting of an H-shaped elastic beam and a support beam.

7. A variable area capacitive lateral acceleration sensor, wherein said variable area capacitive lateral acceleration sensor at least including:
    three-layer stack structure bonded by a first substrate, a second substrate and a third substrate, which are electrically isolated from each other, therein;
    the second substrate includes a movable seismic mass, a frame to surround the movable seismic mass, a elastic beam connected to the movable seismic mass and the frame, a plurality of second bar structure electrodes positioned on the upper surface and the lower surface of the movable seismic mass, an anti-overloading structure arranged on the movable seismic mass and an electrode;
    the plurality of first bar structure electrodes on the first substrate and a plurality of second bar structure electrodes on the second substrate form capacitor structures, respectively, the plurality of third bar structure electrodes on the third substrate and the plurality of second bar structure electrodes on the second substrate form capacitor structures, respectively;
    the first substrate is provided with electrode lead via-holes and an electrode, the third substrate is provided with an electrode.

8. The variable area capacitive lateral acceleration sensor as in claim 7, wherein the gap between a first bar structure electrode and a second bar structure electrode is determined by the thickness of the silicon oxide layer of the first substrate.

9. The variable area capacitive lateral acceleration sensor as in claim 7, wherein the gap between a third bar structure electrode and a second bar structure electrode is determined by the thickness of the oxide layer of the third substrate.

10. The variable area capacitive lateral acceleration sensor as in one of claims 7 to 9, wherein the differential sensitive capacitor structure is formed by combining the capacitor structure which is formed by the first bar structure electrode of the first substrate and the second bar structure electrode of the second substrate, and the capacitor structure which is formed by the third bar structure electrode of the third substrate and the second bar structure electrode of the second substrate.

11. The variable area capacitive lateral acceleration sensor as in claim 7, wherein the elastic beam includes an H-shaped elastic beam.

12. The variable area capacitive lateral acceleration sensor as in claim 7, wherein the elastic beam includes an H-shaped elastic beam and a supporting beam.

\* \* \* \* \*